United States Patent
Zheng et al.

(10) Patent No.: US 11,711,906 B2
(45) Date of Patent: Jul. 25, 2023

(54) TEMPERATURE MANAGEMENT SYSTEM FOR AUTONOMOUS VEHICLES

(71) Applicant: TUSIMPLE, INC., San Diego, CA (US)

(72) Inventors: Kaixin Zheng, San Diego, CA (US); Xiaoling Han, San Diego, CA (US); Zehua Huang, San Diego, CA (US); Todd Skinner, San Diego, CA (US)

(73) Assignee: TUSIMPLE, INC., San Diego, CA (US)

( * ) Notice: Subject to any disclaimer, the term of this patent is extended or adjusted under 35 U.S.C. 154(b) by 480 days.

(21) Appl. No.: 16/781,966

(22) Filed: Feb. 4, 2020

(65) Prior Publication Data

US 2021/0243913 A1    Aug. 5, 2021

(51) Int. Cl.
| | |
|---|---|
| H05K 7/20 | (2006.01) |
| G05D 1/00 | (2006.01) |
| B60R 16/03 | (2006.01) |
| B60R 16/023 | (2006.01) |
| G06F 1/20 | (2006.01) |
| G06F 1/3206 | (2019.01) |
| G06F 1/3287 | (2019.01) |

(52) U.S. Cl.
CPC ......... *H05K 7/202* (2013.01); *B60R 16/0231* (2013.01); *B60R 16/03* (2013.01); *G05D 1/0088* (2013.01); *G06F 1/206* (2013.01); *G06F 1/3206* (2013.01); *G06F 1/3287* (2013.01); *H05K 7/20381* (2013.01); *H05K 7/20863* (2013.01); *H05K 7/20881* (2013.01); *G05D 2201/0213* (2013.01); *Y02D 10/00* (2018.01)

(58) Field of Classification Search
CPC .............. H05K 7/202; H05K 7/20381; H05K 7/20863; H05K 7/20881; B60R 16/0231; B60R 16/03; B60R 16/023; G05D 1/0088; G05D 2201/0213; G06F 1/206; G06F 1/3206; G06F 1/3287; G06F 1/20; Y02D 10/00
See application file for complete search history.

(56) References Cited

U.S. PATENT DOCUMENTS

| | | | |
|---|---|---|---|
| 2010/0030456 A1* | 2/2010 | Chominsky | F02D 41/16 701/112 |
| 2018/0316069 A1* | 11/2018 | Hughes | H01M 10/63 |
| 2018/0335775 A1* | 11/2018 | Konishi | G05D 1/0274 |
| 2018/0344294 A1* | 12/2018 | Chan | A61B 8/4411 |
| 2018/0347447 A1* | 12/2018 | Koshio | F04D 25/08 |
| 2019/0050166 A1* | 2/2019 | Liu | G06F 1/206 |

(Continued)

FOREIGN PATENT DOCUMENTS

KR    200313931 Y1 *  5/2002

*Primary Examiner* — Santosh R Poudel
(74) *Attorney, Agent, or Firm* — Paul Liu; Julie J. Muyco; Perkins Coie, LLP

(57) ABSTRACT

Techniques are described for managing temperature in an autonomous vehicle. An exemplary method comprises performing autonomous driving operations that operate the autonomous vehicle in an autonomous mode, receiving one or more messages from a temperature sensor associated with an electrical device located on or in the autonomous vehicle while the autonomous vehicle is operated in the autonomous mode, determining a cooling technique to reduce the temperature of electrical device, and performing the cooling technique.

20 Claims, 5 Drawing Sheets

(56) References Cited

U.S. PATENT DOCUMENTS

| | | |
|---|---|---|
| 2019/0161076 A1* | 5/2019 | Plianos ................ B60W 30/02 |
| 2019/0315232 A1* | 10/2019 | Ing ......................... B60L 58/26 |
| 2020/0004249 A1* | 1/2020 | Yu ....................... G05D 1/0061 |
| 2020/0238787 A1* | 7/2020 | Awad Alla .............. G06F 1/206 |
| 2020/0376926 A1* | 12/2020 | Nishiyama ......... B60H 1/00878 |

* cited by examiner

TEMPERATURE MANAGEMENT SYSTEM FOR AUTONOMOUS VEHICLES

TECHNICAL FIELD

This document relates to systems, apparatus, and methods to manage temperature of one or more devices operating on or in an autonomous vehicle.

BACKGROUND

Autonomous vehicle navigation is a technology that can allow a vehicle to sense the position and movement of vehicles around an autonomous vehicle and, based on the sensing, control the autonomous vehicle to safely navigate towards a destination. An autonomous vehicle may control the steering angle, a throttle amount to control the speed of the autonomous vehicle, gear changes, and/or a breaking amount to control the extent to which the brakes are engaged. An autonomous vehicle may operate in several modes. In some cases, an autonomous vehicle may allow a driver to operate the autonomous vehicle as a conventional vehicle by controlling the steering, throttle, clutch, gear shifter, and/or other devices. In other cases, a driver may engage the autonomous vehicle navigation technology to allow the vehicle to be driven by itself. Electrical devices located in an autonomous vehicle can generate heat when they perform their respective operations, or such devices can be subjected heat from the sun when the autonomous vehicle is driven on a road or is parked outdoor.

SUMMARY

This patent document describes systems, apparatus, and methods for managing temperature of one or more devices operating on or in an autonomous vehicle.

An exemplary system for managing temperature in an autonomous vehicle comprises one or more computers located in the autonomous vehicle and including one or more processors configured to: perform autonomous driving operations that operate the autonomous vehicle in an autonomous mode; receive one or more messages from a temperature sensor associated with an electrical device located on or in the autonomous vehicle while the autonomous vehicle is operated in the autonomous mode, where each message includes a temperature value that indicates a temperature at which the electrical device is operating; determine a cooling technique to reduce the temperature of electrical device, where the cooling technique is determined based on a comparison between the temperature of the electrical device and a pre-determined threshold value from a set of two or more pre-determined threshold values; and perform the cooling technique In some embodiments, the one or more messages are received and the cooling technique is determined by the one or more processors of the one or more computers being further configured to: receive a first message that includes a first temperature value from a temperature sensor associated with an electrical device located on or in the autonomous vehicle while the autonomous vehicle is operated in the autonomous mode, where the first temperature value indicates the temperature at which the electrical device is operating; perform a first determination that the first temperature value is greater than a first pre-determined threshold value; send, in response to the first determination, a first command that instructs a temperature management device associated with the electrical device to cool the electrical device; the temperature management device comprising a microcontroller configured to perform the cooling technique comprising: receive the first command; and operate the temperature management device based on the first command to cool the electrical device.

In some embodiments, the one or more messages are received and the cooling technique is determined and performed by the one or more processors of the one or more computers being further configured to: receive, after sending the first command, a second message that includes a second temperature value from the temperature sensor associated with the electrical device; perform a second determination that the second temperature value is greater than a second pre-determined threshold value, where the second pre-determined threshold value is higher than the first pre-determined threshold value; and perform, in response to the second determination, an autonomous driving emergency operation.

In some embodiments, the autonomous driving emergency operation is performed by the one or more processors being configured to disable the autonomous vehicle from being driven in the autonomous mode. In some embodiments, the autonomous driving emergency operation is performed by the one or more processors being configured to perform driving operations that cause the autonomous vehicle to be parked on a side of a road. In some embodiments, the autonomous driving emergency operation includes sending a message to be displayed on a monitor associated with the one or more computers, the message indicates a recommendation to disengage the autonomous mode on the autonomous vehicle, and the message includes an identification of the electrical device and a timer that indicates when the electrical device is expected to reach a known highest operating temperature.

In some embodiments, the autonomous driving emergency operation is performed by the one or more processors being configured to perform a de-rating operation that reduces a computational load or an electrical load on the electrical device. In some embodiments, one or more processors included in the one or more computers is further configured to: receive, after performing the autonomous driving emergency operation, an indication that the autonomous vehicle or the one or more computers are instructed to turn off; and send, after receiving the indication, a third command to the temperature management device that instructs the temperature management device to cool the electrical device for a pre-determined time after the autonomous vehicle or the one or more computers are turned off. In some embodiments, prior to the performed autonomous driving operations, the one or more processors included in the one or more computers are further configured to: receive a third message that includes a third temperature value from the temperature sensor associated with the electrical device; perform a determination that the third temperature value is greater than a pre-defined threshold value; and prevent, in response to the determination, the autonomous vehicle from performing the autonomous driving operations.

In some embodiments, the temperature management device includes a fan, a liquid cooling device, a liquid-to-air cooling device, or an air-conditioning unit. In some embodiments, the first command instructs the temperature management device to turn on, or increase speed of a motor or pump that circulates air or liquid coolant, or reduce a temperature of air circulated by the temperature management device. In some embodiments, the electrical device includes a power supply box, a network router, an Ethernet switch, an inverter, a backup power supply device, or the one or more computers. In some embodiments, the first message and the second message include an identifier associated with the electrical device.

An exemplary method of managing temperature in an autonomous vehicle comprises performing autonomous driving operations that operate the autonomous vehicle in an autonomous mode; receiving a first message that includes a first temperature value from a temperature sensor associated with an electrical device located on or in the autonomous vehicle while the autonomous vehicle is operated in the autonomous mode; performing a first determination that the first temperature value is greater than a first pre-determined threshold value; sending, in response to the first determination, a first command that instructs a temperature management device associated with the electrical device to cool the electrical device; receiving, after sending the first command, a second message that includes a second temperature value from the temperature sensor associated with the electrical device; performing a second determination that the second temperature value is greater than a second pre-determined threshold value, where the second pre-determined threshold value is higher than the first pre-determined threshold value; and performing, in response to the second determination, an autonomous driving emergency operation.

In some embodiments, the autonomous driving emergency operation includes disabling the autonomous vehicle from being driven in the autonomous mode. In some embodiments, the autonomous driving emergency operation includes performing driving operations that cause the autonomous vehicle to be parked on a side of the road.

In some embodiments, prior to the performed autonomous driving operations, the method comprises: receiving a third message that includes a third temperature value from the temperature sensor associated with the electrical device; performing a determination that the third temperature value is greater than a pre-defined threshold value; and preventing, in response to the determination, the autonomous vehicle from performing the autonomous driving operations. In some embodiments, the method further comprises receiving a third message that includes a third temperature value from the temperature sensor associated with the electrical device; performing a determination that the third temperature value is greater than a pre-defined threshold value; and preventing, in response to the determination, the autonomous vehicle from performing the autonomous driving operations.

In yet another exemplary aspect, the above-described method is embodied in a non-transitory computer readable storage medium. The non-transitory computer readable storage medium includes code that when executed by a processor, causes the processor to perform the methods described in this patent document.

In yet another exemplary embodiment, a device that is configured or operable to perform the above-described methods is disclosed.

The above and other aspects and their implementations are described in greater detail in the drawings, the descriptions, and the claims.

DETAILED DESCRIPTION

An autonomous vehicle is configured to operate on a road without much intervention from a human driver. An autonomous vehicle can include a computer located in the vehicle that can operate the vehicle in an autonomous mode by controlling various system of the vehicle. For example, the computer can perform image processing on images obtained from cameras on the vehicle to determine the location of objects that surround the vehicle. Based on the image processing, the computer can safely operate the vehicle by controlling a steering angle of the steering system, a throttle amount to control the speed of the vehicle, a transmission gear, and/or a braking amount to control the extent to which the brakes are engaged.

To safely operate the vehicle in an autonomous mode, several sensors are distributed around the vehicle so that the sensors are coupled to different places on the vehicle. Sensors located at different places on the vehicle enable a computer located in the vehicle to obtain sensor data that describes different regions (e.g., front, rear, side) of an environment in which the vehicle is being driven. This patent document describes exemplary techniques to manage the temperature of electrical devices (e.g., sensors, power supply boxes, Ethernet switch(es)) located on or in a vehicle so that these electrical devices can operate within a safe temperature range and can thereby facilitate safe autonomous vehicle operations.

Figure 1:
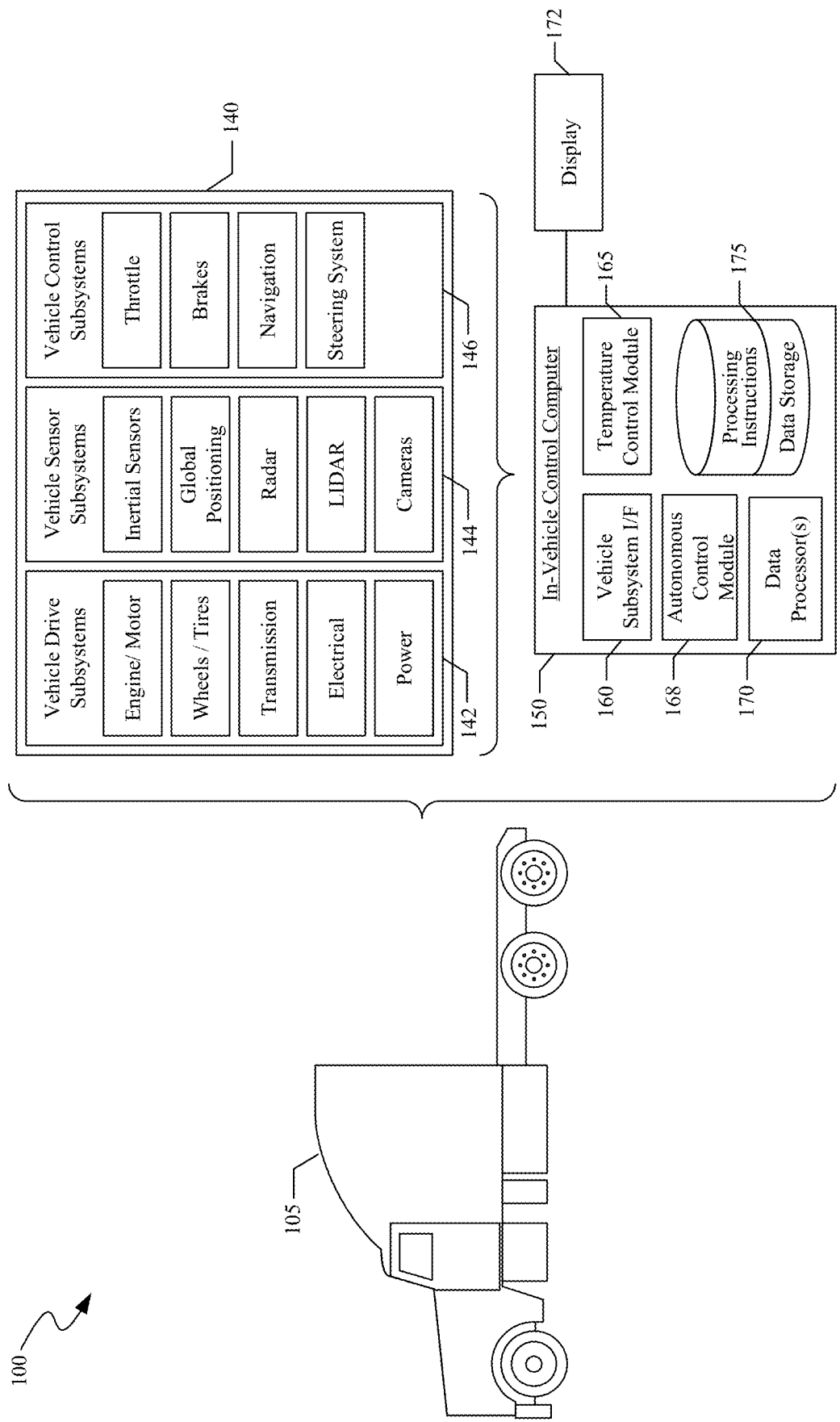
FIG. 1 shows a block diagram of an example vehicle ecosystem in which techniques for managing temperature of electrical devices in the autonomous vehicle can be implemented.

FIG. 1 shows a block diagram of an example vehicle ecosystem 100 in which techniques for managing temperature of electrical devices in the autonomous vehicle 105 can be implemented in an in-vehicle control computer 150. The vehicle ecosystem 100 includes several systems and electrical devices that can generate and/or deliver one or more sources of information/data and related services to the in-vehicle control computer 150 that may be located in an autonomous vehicle 105. Examples of autonomous vehicle 105 include a car, a truck, or a semi-trailer truck. The in-vehicle control computer 150 can be in data communication with a plurality of vehicle subsystems 140, all of which can be resident in an autonomous vehicle 105. A vehicle subsystem interface 160 is provided to facilitate data communication between the in-vehicle control computer 150 and the plurality of vehicle subsystems 140. The vehicle subsystem interface can include a wireless transceiver, a Controller Area Network (CAN) transceiver, an Ethernet transceiver, or any combination thereof.

The autonomous vehicle 105 may include various vehicle subsystems that support of the operation of autonomous vehicle 105. The vehicle subsystems may include a vehicle drive subsystem 142, a vehicle sensor subsystem 144, and/or a vehicle control subsystem 146. The vehicle drive subsystem 142 may include components operable to provide powered motion for the autonomous vehicle 105. In an example embodiment, the vehicle drive subsystem 142 may include an engine or motor, wheels/tires, a transmission, an electrical subsystem, and a power source.

The vehicle sensor subsystem 144 may include a number of sensors configured to sense information about an environment or condition of the autonomous vehicle 105. For example, the vehicle sensor subsystem 144 may include an inertial measurement unit (IMU), a Global Positioning System (GPS) transceiver, a RADAR unit, a laser range finder/LIDAR unit, and/or one or more cameras or image capture devices. The vehicle sensor subsystem 144 may also include sensors configured to monitor internal systems of the autonomous vehicle 105 (e.g., an $O_2$ monitor, a fuel gauge, an engine oil temperature).

Figure 2A:
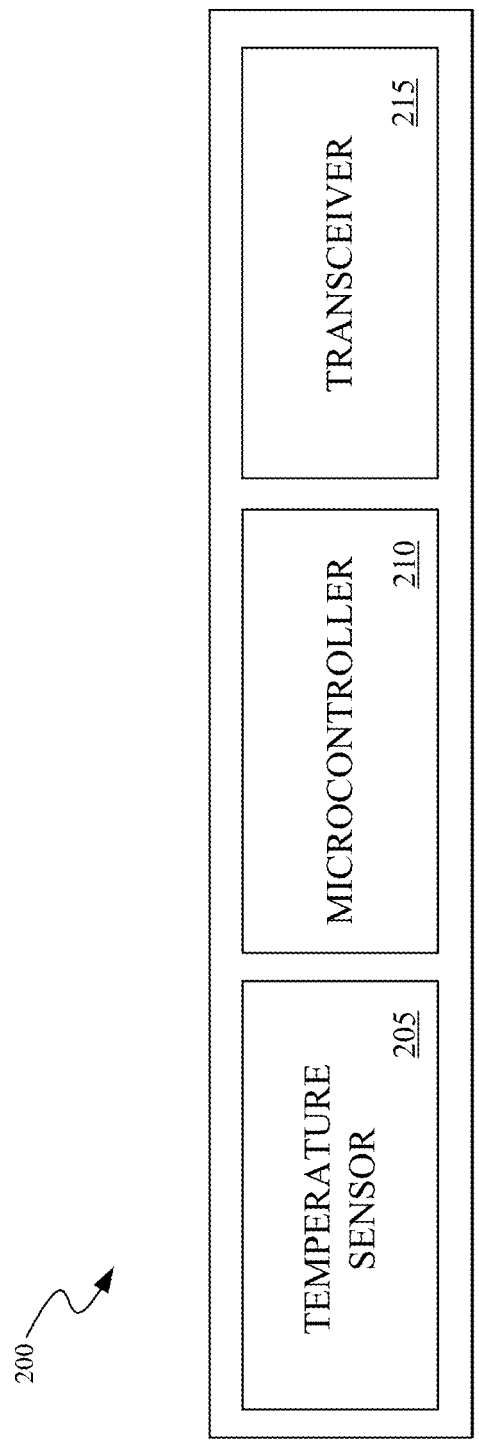
FIG. 2A shows an exemplary block diagram of a temperature sensor unit for a temperature management system.

FIG. 2A shows an exemplary block diagram of a temperature sensor unit for a temperature management system. A temperature sensor unit 200 may include a temperature sensor 205 and a microcontroller 210. Temperature sensor units 200 may be located on or in several critical autonomous driving related critical electrical devices (herein referred to as "critical electrical devices") located in the autonomous vehicle 105. Critical electrical devices can include power supply boxes, power distribution units, network routers, Ethernet switches, inverters, backup power supply device (e.g., uninterruptable power supply device), computers with graphic processing unit (GPU) or central processing unit (CPU) to perform image processing on images obtained from cameras on the vehicle such as the in-vehicle control computer described in FIG. 1, etc., In the temperature sensor unit 200, the microcontroller 210 can be programmable to execute code stored in the microcontroller's memory to enable the microcontroller to instruct a cooling device coupled to or associated with a critical electrical device to cool the critical electrical device if the microcontroller determines that the temperature value measured by the temperature sensor has exceeded a pre-determined temperature threshold. The temperature senor unit may include a communication transceiver 215 so that the microcontroller can communicate with and instruct the cooling device (e.g., via a wireless channel, a CAN bus, or the Ethernet). A cooling device may be a fan, a liquid cooling pump, a liquid-to-air cooling device, or an air-conditioning unit. In some embodiments, the microcontroller can instruct the cooling device to turn on or to increase its speed, or to decrease the temperature of the air or liquid circulated by the cooling device on the critical electrical device or in an environment that includes the critical electrical device. In some embodiments, the microcontroller in the temperature sensor unit can provide measured temperature values of a critical electrical device to the in-vehicle control computer via the transceiver 215.

Figure 2B:
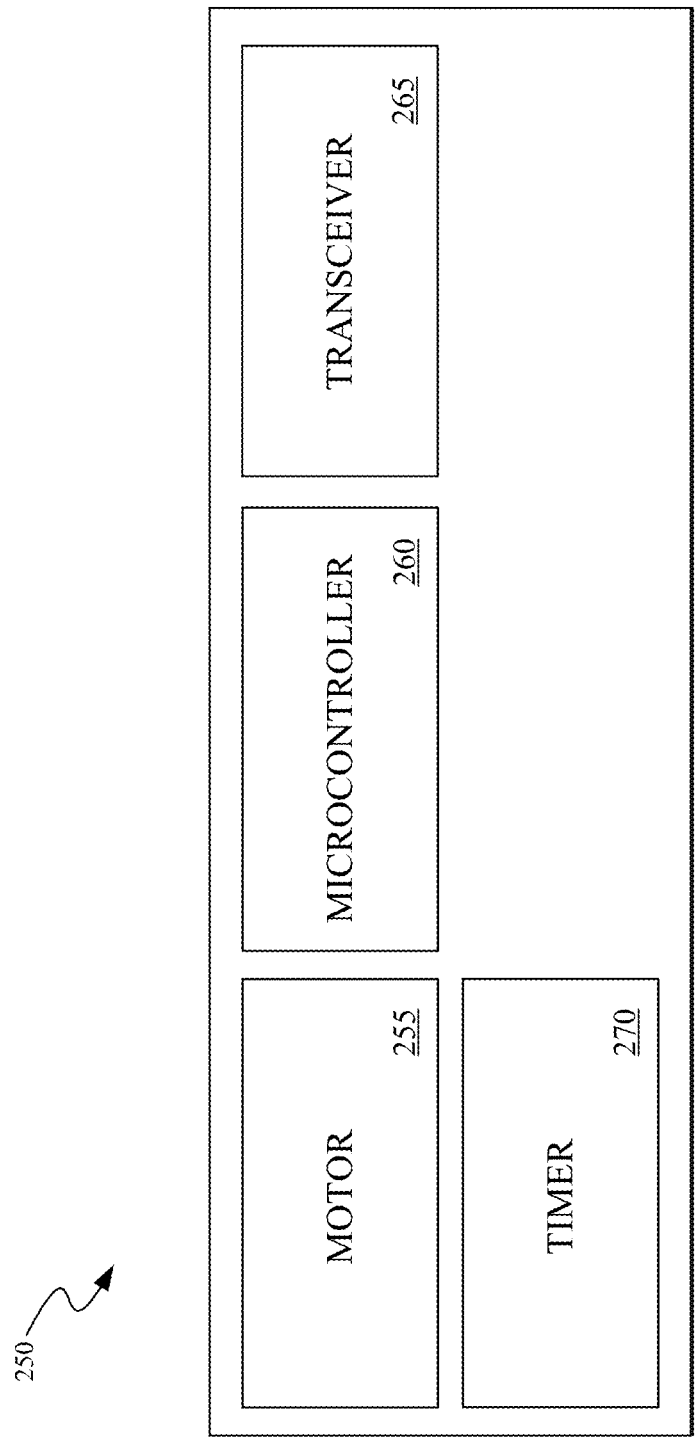
FIG. 2B shows a block diagram of a cooling device.

FIG. 2B shows a block diagram of a cooling device 250. The cooling device may include a motor 255 to operate a fan or to circulate liquid coolant, a microcontroller 260 to execute commands provided to the cooling device 250, and a transceiver to receive the commands from the temperature sensor unit or the temperate control module of the in-vehicle control computer. In some embodiments, the cooling device 250 can also include a timer 270 that can enable the cooling device 250 to be operated for a length of time after the autonomous vehicle has been turned off or shutdown as further explained in this patent document.

In FIG. 1, the temperature control module 165 of the in-vehicle control computer 150 can receive temperature values from the temperature sensor unit and can determine whether a measured temperature value exceeds one or more pre-determined temperature thresholds. As further explained in this patent document, the temperature control module 165 can instruct the cooling device associated with the critical electrical device to operate in a manner to cool down the critical electrical device that may be running hot.

In FIG. 1, the IMU may include any combination of sensors (e.g., accelerometers and gyroscopes) configured to sense position and orientation changes of the autonomous vehicle 105 based on inertial acceleration. The GPS transceiver may be any sensor configured to estimate a geographic location of the autonomous vehicle 105. For this purpose, the GPS transceiver may include a receiver/transmitter operable to provide information regarding the position of the autonomous vehicle 105 with respect to the Earth. The RADAR unit may represent a system that utilizes radio signals to sense objects within the local environment of the autonomous vehicle 105. In some embodiments, in addition to sensing the objects, the RADAR unit may additionally be configured to sense the speed and the heading of the objects proximate to the autonomous vehicle 105. The laser range finder or LIDAR unit may be any sensor configured to sense objects in the environment in which the autonomous vehicle 105 is located using lasers. The cameras may include one or more devices configured to capture a plurality of images of the environment of the autonomous vehicle 105. The cameras may be still image cameras or motion video cameras.

The vehicle control subsystem 146 may be configured to control operation of the autonomous vehicle 105 and its components. Accordingly, the vehicle control subsystem 146 may include various elements such as a throttle, a brake unit, a navigation unit, and/or a steering system.

The throttle may be configured to control, for instance, the operating speed of the engine and, in turn, control the speed of the autonomous vehicle 105. The brake unit can include any combination of mechanisms configured to decelerate the autonomous vehicle 105. The brake unit can use friction to slow the wheels in a standard manner. The navigation unit may be any system configured to determine a driving path or route for the autonomous vehicle 105. The navigation unit may additionally be configured to update the driving path dynamically while the autonomous vehicle 105 is in operation. In some embodiments, the navigation unit may be configured to incorporate data from the GPS transceiver and one or more predetermined maps so as to determine the driving path for the autonomous vehicle 105.

The autonomous control module 168 in the in-vehicle control computer 150 may be configured to identify, evaluate, and avoid or otherwise negotiate potential obstacles in the environment of the autonomous vehicle 105. In general, the autonomous control module 168 may be configured to control the autonomous vehicle 105 for operation without a driver or to provide driver assistance in controlling the autonomous vehicle 105. In some embodiments, the autonomous control module 168 may be configured to incorporate data from the GPS transceiver, the RADAR, the LIDAR, the cameras, and/or other vehicle subsystems to determine the driving path or trajectory for the autonomous vehicle 105. The autonomous control module 168 can be activated to enable the vehicle 105 to be driven in an autonomous mode. In an example implementation, a monitor or display 172 associated with the in-vehicle control computer 150 can show on a graphical user interface (GUI) a prompt to request a driver to indicate whether he or she wants the vehicle 105 to be driven in autonomous mode. Upon receiving an indication that the driver wants the vehicle 105 to be driven in autonomous mode, the autonomous control module 168 can operate the vehicle 105 autonomously. In some embodiments, as further explained in this patent document in FIG. 3, the temperature control module 165 can send a command to the autonomous control module 168 to disengage autonomous driving operation or to determine driving path or trajectory to safely park the vehicle 105 on the side of the road if a critical electrical device is operating at a hazardous temperature.

Many or all of the functions of the autonomous vehicle 105 can be controlled by the in-vehicle control computer 150. The in-vehicle control computer 150 may include at least one data processor 170 (which can include at least one microprocessor) that executes processing instructions stored in a non-transitory computer readable medium, such as the data storage device 175 or memory. The in-vehicle control computer 150 may also represent a plurality of computing devices that may serve to control individual components or subsystems of the autonomous vehicle 105 in a distributed fashion. In some embodiments, the data storage device 175 may contain processing instructions (e.g., program logic) executable by the data processor 170 to perform various methods and/or functions of the autonomous vehicle 105, including those described in this patent document. For instance, the data processor 170 executes the operations associated with temperature control module 165 for managing the temperature of critical electrical devices on or in the autonomous vehicle 105. The data storage device 175 may contain additional instructions as well, including instructions to transmit data to, receive data from, interact with, or control one or more of the vehicle drive subsystem 142, the vehicle sensor subsystem 144, and the vehicle control subsystem 146. In some embodiment, additional components or devices can be added to the various subsystems or one or more components or devices (e.g., LiDAR or Radar shown in FIG. 1) can be removed without affecting the techniques described in this patent document for the temperature management system. The in-vehicle control computer 150 can be configured to include a data processor 170 and a data storage device 175.

The in-vehicle control computer 150 may control the function of the autonomous vehicle 105 based on inputs received from various vehicle subsystems (e.g., the vehicle drive subsystem 142, the vehicle sensor subsystem 144, and the vehicle control subsystem 146). For example, the in-vehicle control computer 150 may use input from the vehicle control subsystem 146 in order to control the steering system to avoid an obstacle detected by the vehicle sensor subsystem 144, move in a controlled manner, or follow a path or trajectory. In an example embodiment, the in-vehicle control computer 150 can be operable to provide control over many aspects of the autonomous vehicle 105 and its subsystems.

The example headings for the various sections below are used to facilitate the understanding of the disclosed subject matter and do not limit the scope of the claimed subject matter in any way. Accordingly, one or more features of one example section can be combined with one or more features of another example section.

I. Temperature Management During Autonomous Driving

Figure 3:
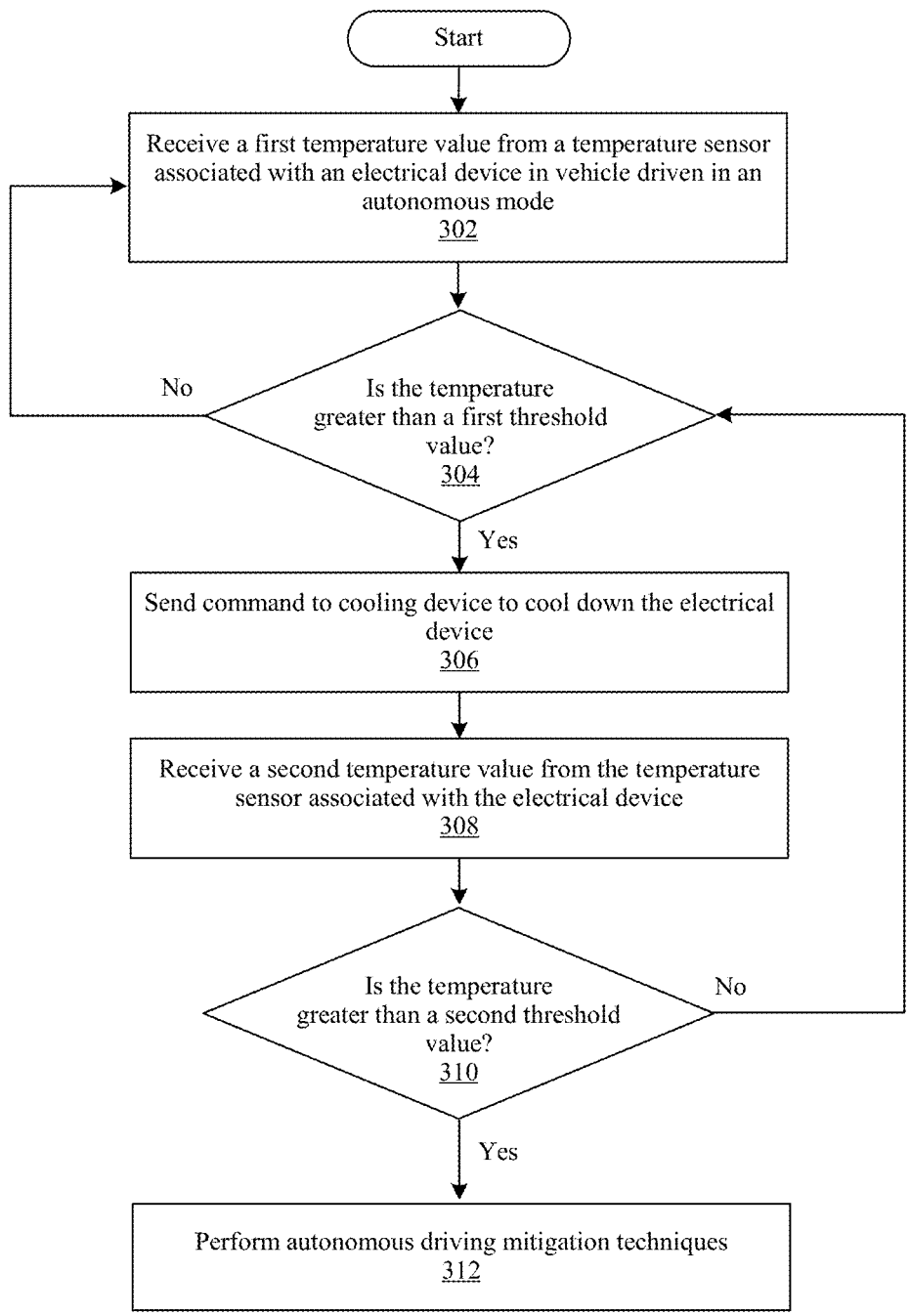
FIG. 3 shows an exemplary flow diagram to manage temperature of a critical electrical device in an autonomous vehicle.

FIG. 3 shows an exemplary flow diagram to manage temperature of a critical electrical device in an autonomous vehicle. At the receiving operation 302, the temperature control module of the in-vehicle control computer can receive a first temperature value from a temperature sensor associated with a critical electrical device located in a vehicle that is driven in an autonomous mode. In some embodiments, the temperature sensor unit can send the temperature value with an identifier that identifies the critical electrical device whose temperature is being provided by the temperature sensor unit. As described in this patent document, a vehicle can be driven in an autonomous mode by an in-vehicle control computer that can perform signal/image processing on sensor data or images provided by cameras to operate various systems (e.g., steering, brakes, transmission, engine, etc.) of the vehicle without human intervention.

At the determining operation 304, the temperature control module can determine whether the received temperature is greater than a first threshold temperature value. If the received temperature is not greater than a first threshold temperature value, then the temperature control module returns to the receiving operation 302 where it can receive another temperature value to perform operations described in FIG. 3. In some embodiments, a temperature sensor unit described in this patent document can provide temperature values periodically (e.g., every one second, every 2 seconds, every 5 seconds, every ten seconds, etc.).

If the received temperature is greater than a first threshold temperature value, then the temperature control module can send a command to a cooling device associated with the critical electrical device to cool down the critical electrical device at the sending operation 306. After the sending operation 306, the temperature control module can receive a second temperature value from the temperature sensor associated with the critical electrical device. The second temperature can indicate what effect (if any) the cooling device is having on the critical electrical device. For example, if the sending operation 306 indicates to a fan associated with the critical electrical device to turn on, and if the second temperature value is received at some time period (e.g., 15 seconds) after the fan is turned on, then the second temperature value can indicate whether the fan is successful in cooling down the critical electrical device. In another example, if the sending operation 306 indicates to an air-conditioning (AC) unit associated with a zone in which the critical electrical device is located to generate cool air at 62 degrees, and if the second temperature value is received at some time period (e.g., 10 seconds) after the A/C unit blows cool air, then the second temperature value can indicate whether the fan is successful in cooling down the critical electrical device. The receiving operation 308 may be the result of the temperature sensor unit periodically providing temperature values of the critical electrical device or the temperature control unit requesting the microcontroller unit of the temperature sensor unit to provide a temperature value.

At the determining operation 310, the temperature control module can determine if the second temperature value is greater than a second threshold value, where the second threshold value is greater than the first threshold value. If the second temperature value is not greater than a second threshold value, then the temperature control module can perform the determining operation 304.

There are several technical advantages to having two temperature thresholds with which the temperature of critical electrical devices in an autonomous vehicle can be managed. One of the technical benefits of having a first and a second temperature threshold, and the determinations performed at operations 304 and 310, is to enable the temperature management system to employ cooling techniques based on a measured temperature of a critical electrical device. If a measured temperature is higher than a first threshold value but less than a maximum temperature value at which the critical electrical device can operate, then the temperature management system can employ cooling techniques to cool down the critical electrical device. If a measured temperature is higher than a second threshold value which is higher than the first threshold value and approaching the maximum temperature value of the critical electrical device, then the temperature management system can employ a more drastic measure to cool down the critical electrical device (e.g., disabling autonomous mode, or initiating emergency parking sequence to safety stop the vehicle).

At the determining operation 310, if the second temperature value is greater than a second threshold value, then the temperature control module can determine that the critical electrical device is operating at a temperature that can cause the critical electrical device to malfunction or stop working, which can be hazardous to autonomous driving operation. For example, if the critical electrical device is an Ethernet router that is used to receive images from cameras located on the autonomous vehicle and send to the in-vehicle control computer to perform image processing for autonomous driving, and if the Ethernet router is operating at a high temperature that causes the Ethernet router to shut down or reboot, then such a scenario can be detrimental for autonomous driving operation. If the second temperature value is greater than a second threshold value, then the temperature control module can perform autonomous driving mitigation techniques 312 such as sending a command to the autonomous control module to disengage or disable autonomous mode or to determine driving path or trajectory to perform driving operations to safely park the vehicle on the side of the road.

At the performing operation 312, the temperature control module can send a message to be displayed on the display associated with the in-vehicle control computer that instructs the driver of an over-temperature condition and that autonomous mode is disengaged or that the vehicle is being safely driven to park the vehicle on the side of the road. In some embodiments, after the performing operation 312 is executed and the vehicle is either operating in a driver-controlled mode (and not in autonomous mode) or has parked the vehicle on the side of the road, the temperature control module can send a command to the autonomous control module to prevent autonomous mode to be engaged until the temperature of the critical electrical device is determined by the temperature control module to be below the second threshold value. Thus, the temperature management techniques can enable the critical electrical device to be cooled down to a safe temperature range below the second threshold value.

II. Temperature Management Prior to Autonomous Mode Operation

In some scenarios, a vehicle with autonomous driving capability can be parked outdoor or driven and may be subjected to heat from the sun. In such scenarios, the critical electrical devices can be exposed to extreme temperatures. When the vehicle is first turned on or at any time prior to when autonomous mode is engaged, the temperature control module in the in-vehicle control module can receive a temperature from the temperature sensor associated with a critical electrical device. If the temperature control module determines that the temperature of the critical electrical device is above a pre-defined threshold value (e.g., the second threshold value as explained in FIG. 3), then the temperature control module can send a command to the autonomous control module to prevent autonomous mode to be engaged until the temperature of the critical electrical device is determined by the temperature control module to be below the threshold value. In some embodiments, when a driver indicates via a GUI associated with display of the in-vehicle control computer that he or she wants to engage autonomous mode operation, the temperature control module can compare temperature values of the critical electrical devices to their respective threshold values to determine whether autonomous mode should be allowed.

III. Temperature Management to Advise Shutdown or De-Rated Operation

In some scenarios, when a vehicle is being operated in an autonomous mode and one of the critical electrical devices is operating at a temperature deemed to be high enough to be unsafe for autonomous driving, such as described in operations 310 and 312 of FIG. 3, the temperature control module can perform additional or alternative operations at the performing operation 312.

In some embodiments, the temperature control module can advise a shutdown of the autonomous mode or of the vehicle if the temperature control module can, based on the rate at which the temperature of the critical electrical device is increasing, calculates that the critical electrical device may reach its previously known highest operating temperature within a pre-determined time window (e.g., within the next 10 minutes or next 1 minute or next 2 minute from when the temperature control module calculates that the critical electrical device will reach its previously known highest operating temperature). For example, the temperature values received at operations 302 and 308 can be associated with a timestamp with which the temperature control module can determine a rate at which the temperature of the critical electrical device may be increasing. Since the highest operating temperature of the critical electrical device may be previously known by the temperature control module (e.g., the highest operating temperature may be provided by a manufacturer of a device), the temperature control module can calculate the time when the critical electrical device would be expected to reach and operate at its highest operating temperature.

If the calculated time is within a pre-determined window (e.g., 10 minutes), then the temperature control module can send a message to the display associated with the in-vehicle control computer to show a message to the driver that recommends that autonomous mode is recommended to be disengaged by the driver due to excessive temperature of the critical electrical device. In some embodiments, the message may be shown with an identification of the critical electrical device that is experiencing excessive heat and a timer that can count down from the time calculated by the temperature control module when the critical electrical device is expected to reach its highest operating temperature. The displayed message may also include a button that enables the driver to disengage autonomous mode. Upon receiving an indication that the driver wants the vehicle to be disengaged from autonomous mode, the autonomous control module can cease autonomous driving operation and allow the driver to control the vehicle.

In some embodiments, the temperature control module can de-rate operations of the in-vehicle control computer or other critical electrical device(s) if the temperature control module can, based on the rate at which the temperature of the critical electrical device is increasing, calculates that the critical electrical device may reach its previously known highest operating temperature within a pre-determined time window (e.g., within the next 10 minutes). A de-rated operation can include the temperature control module sending a command to the in-vehicle control computer to disable parallel or redundant processing performed by the in-vehicle control computer. In other examples, a de-rated operation can include instructing the camera to provide images at a lower image frame rate (e.g., 12 frames per second (fps) as opposed to 60 fps) or instructing the in-vehicle control computer to perform image processing on every n-th image frame provided by the camera instead of on every image frame (e.g., on every fifth image frame provided by the cameras).

IV. Temperature Management after Vehicle is Powered Down

In some embodiments, when the driver initiates the process to power down the vehicle (e.g., indicates via the display of the in-vehicle control computer to safely shutdown the system), the temperature control module can send a command to a timer associated with a cooling device (shown as 270 in FIG. 2B) to enable the cooling device to continue to cool the critical electrical device(s) that are determined to operate above a threshold value (e.g., the second threshold value as explained in FIG. 3) for a length of time after the vehicle has been turned off or shut down. In some embodiments, the command sent by the temperature control module to the microcontroller of the temperature sensor unit can indicate an amount of time that that the cooling device is expected to operate. For example, when the in-vehicle control computer or the autonomous vehicle is instructed to shut down, the temperature control module can instruct the timer of the cooling device to continue to operate for a pre-determined length of time (e.g., 2 minutes) to continue to cool down critical electrical device associated with the cooling device. In some embodiments, the temperature control module can enter after-run mode after the in-vehicle control computer is instructed to shut down, where the temperature control module in the after-run mode can, for example, interrupt the shutdown and can continue to monitor the temperature and instruct the cooling device to continue to cool the devices until the devices reach a pre-determined temperature (e.g., ambient temperature).

In some embodiments, the temperature control module can control the cooling device to minimize humidity or condensation. For example, a temperature control module can send a commend to an air-conditioning unit to turn on to dehumidify or to minimize condensation the area where the critical electrical device is located.

Figure 4:
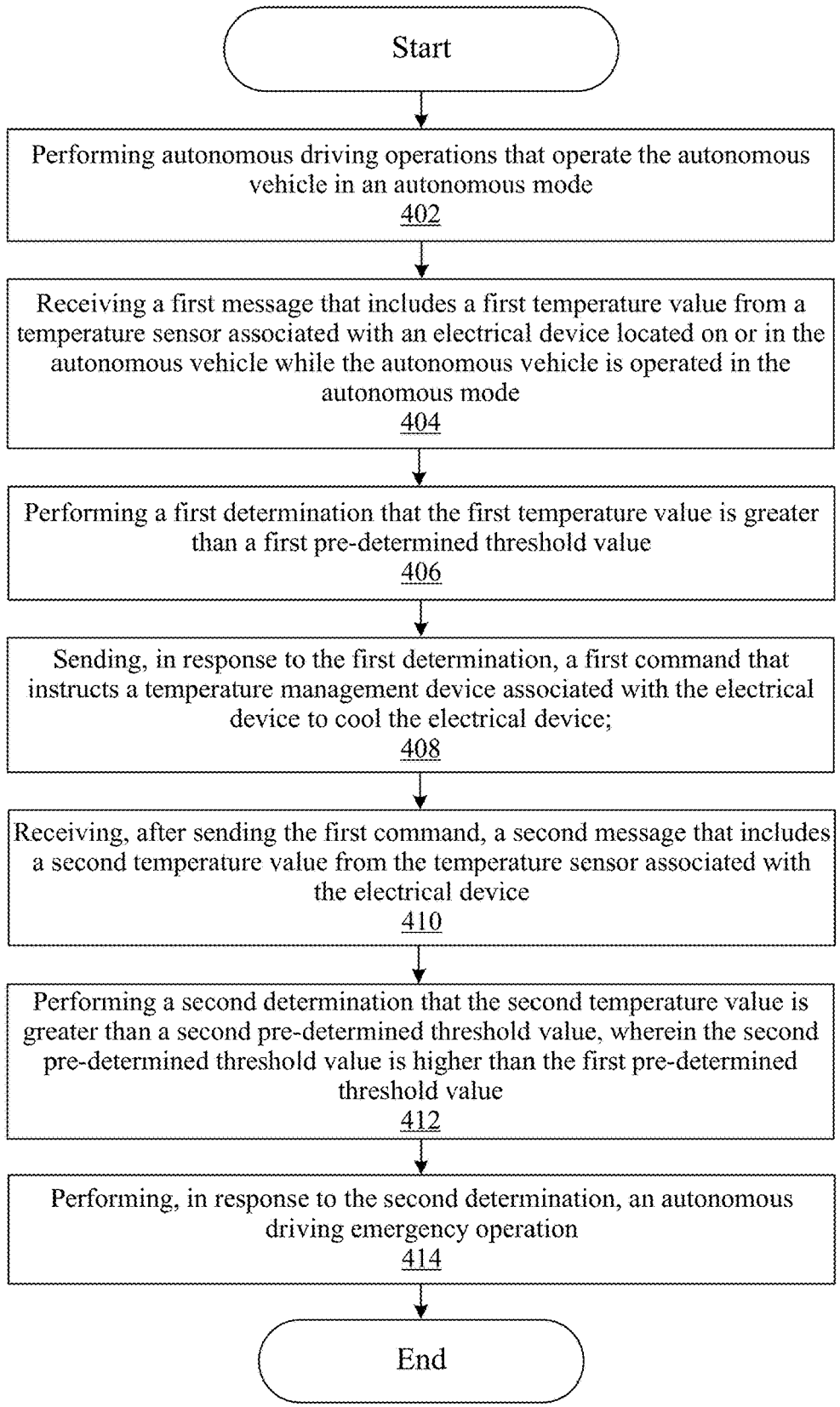
FIG. 4 shows another exemplary flow diagram to manage temperature of electrical devices on or in an autonomous vehicle.

FIG. 4 shows another exemplary flow diagram to manage temperature of electrical devices on or in an autonomous vehicle. In some embodiments, one or more computers located in the autonomous vehicle, where each computer includes a processor that is configured to perform operations 402 to 414. At the performing operation 402, performing autonomous driving operations that operate the autonomous vehicle in an autonomous mode. At the receiving operation 404, receiving a first message that includes a first temperature value from a temperature sensor associated with an electrical device located on or in the autonomous vehicle while the autonomous vehicle is operated in the autonomous mode.

At the performing operation 406, performing a first determination that the first temperature value is greater than a first pre-determined threshold value. At the sending operation 408, sending, in response to the first determination, a first command that instructs a temperature management device associated with the electrical device to cool the electrical device. At the receiving operation 410, receiving, after sending the first command, a second message that includes a second temperature value from the temperature sensor associated with the electrical device.

At the performing operation 412, performing a second determination that the second temperature value is greater than a second pre-determined threshold value, where the second pre-determined threshold value is higher than the first pre-determined threshold value. At the performing operation 414, performing, in response to the second determination, an autonomous driving emergency operation.

In some embodiments, the autonomous driving emergency operation includes disabling the autonomous vehicle from being driven in the autonomous mode. In some embodiments, the autonomous driving emergency operation includes performing driving operations that cause the autonomous vehicle to be parked on a side of the road. In some embodiments, the autonomous driving emergency operation includes sending a message to be displayed on a monitor associated with one or more computers located in the autonomous vehicle, where the message indicates a recommendation to disengage the autonomous mode on the autonomous vehicle, and where the message includes an identification of the electrical device and a timer that indicates when the electrical device is expected to reach a known highest operating temperature. In some embodiments, the autonomous driving emergency operation is performed by the one or more processors being configured to perform a de-rating operation that reduces a computational load or an electrical load on the electrical device.

In some embodiments, the method of FIG. 4 further comprises receiving, after performing the autonomous driving emergency operation, an indication that the autonomous vehicle or one or more computers located in the autonomous vehicle are instructed to turn off, and sending, after receiving the indication, a third command to the temperature management device that instructs the temperature management device to cool the electrical device for a pre-determined time after the autonomous vehicle or the one or more computers are turned off In some embodiments, prior to the performed autonomous driving operations, the method shown in FIG. 4 further comprises: receiving a third message that includes a third temperature value from the temperature sensor associated with the electrical device; performing a determination that the third temperature value is greater than a pre-defined threshold value; preventing, and in response to the determination, the autonomous vehicle from performing the autonomous driving operations. In some embodiments, the temperature management device includes a fan, a liquid cooling device, a liquid-to-air cooling device, or an air-conditioning unit.

In some embodiments, the first command instructs the temperature management device to turn on, or increase speed of a motor or pump that circulates air or liquid coolant, or reduce a temperature of air circulated by the temperature management device. In some embodiments, the electrical device includes a power supply box, a network router, an Ethernet switch, an inverter, a backup power supply device, or one or more computers. In some embodiments, the first message and the second message include an identifier associated with the electrical device.

In this document the term "exemplary" is used to mean "an example of" and, unless otherwise stated, does not imply an ideal or a preferred embodiment. In this document, the term "microcontroller" can include a processor and its associated memory.

Some of the embodiments described herein are described in the general context of methods or processes, which may be implemented in one embodiment by a computer program product, embodied in a computer-readable medium, including computer-executable instructions, such as program code, executed by computers in networked environments. A computer-readable medium may include removable and non-removable storage devices including, but not limited to, Read Only Memory (ROM), Random Access Memory (RAM), compact discs (CDs), digital versatile discs (DVD), etc. Therefore, the computer-readable media can include a non-transitory storage media. Generally, program modules may include routines, programs, objects, components, data structures, etc. that perform particular tasks or implement particular abstract data types. Computer- or processor-executable instructions, associated data structures, and program modules represent examples of program code for executing steps of the methods disclosed herein. The particular sequence of such executable instructions or associated data structures represents examples of corresponding acts for implementing the functions described in such steps or processes.

Some of the disclosed embodiments can be implemented as devices or modules using hardware circuits, software, or combinations thereof. For example, a hardware circuit implementation can include discrete analog and/or digital components that are, for example, integrated as part of a printed circuit board. Alternatively, or additionally, the disclosed components or modules can be implemented as an Application Specific Integrated Circuit (ASIC) and/or as a Field Programmable Gate Array (FPGA) device. Some implementations may additionally or alternatively include a digital signal processor (DSP) that is a specialized microprocessor with an architecture optimized for the operational needs of digital signal processing associated with the disclosed functionalities of this application. Similarly, the various components or sub-components within each module may be implemented in software, hardware or firmware. The connectivity between the modules and/or components within the modules may be provided using any one of the connectivity methods and media that is known in the art, including, but not limited to, communications over the Internet, wired, or wireless networks using the appropriate protocols.

While this document contains many specifics, these should not be construed as limitations on the scope of an invention that is claimed or of what may be claimed, but rather as descriptions of features specific to particular embodiments. Certain features that are described in this document in the context of separate embodiments can also be implemented in combination in a single embodiment. Conversely, various features that are described in the context of a single embodiment can also be implemented in multiple embodiments separately or in any suitable sub-combination. Moreover, although features may be described above as acting in certain combinations and even initially claimed as such, one or more features from a claimed combination can in some cases be excised from the combination, and the claimed combination may be directed to a sub-combination or a variation of a sub-combination. Similarly, while operations are depicted in the drawings in a particular order, this should not be understood as requiring that such operations be performed in the particular order shown or in sequential order, or that all illustrated operations be performed, to achieve desirable results.

Only a few implementations and examples are described and other implementations, enhancements and variations can be made based on what is described and illustrated in this disclosure.

What is claimed is:

1. A system for managing temperature in an autonomous vehicle, comprising:
one or more computers located in the autonomous vehicle and including one or more processors configured to:
perform autonomous driving operations that operate the autonomous vehicle in an autonomous mode;
receive a first message that includes a first temperature value from a temperature sensor associated with an electrical device located on or in the autonomous vehicle while the autonomous vehicle is operated in the autonomous mode, wherein the first temperature value indicates a temperature at which the electrical device is operating;
perform a first determination that the first temperature value is greater than a first pre-determined threshold value;
send, in response to the first determination, a first command that instructs a temperature management device associated with the electrical device to cool the electrical device, wherein the first command instructs the temperature management device to increase speed of a motor or pump that circulates air or liquid coolant;
receive, after the first command is sent, a second message that includes a second temperature value from the temperature sensor associated with the electrical device;
perform a second determination that the second temperature value is greater than a second pre-determined threshold value, wherein the second pre-determined threshold value is higher than the first pre-determined threshold value;
perform, in response to the second determination, an autonomous driving emergency operation;
receive, after the autonomous driving emergency operation is performed, an indication that the autonomous vehicle is instructed to turn off or the one or more computers are instructed to turn off; and
send, after the indication is received, a second command to the temperature management device that instructs the temperature management device to cool the electrical device for a pre-determined time after the autonomous vehicle is turned off or the one or more computers are turned off;
wherein the temperature management device comprises a microcontroller configured to perform a cooling technique comprising:
receiving the first command; and
operating the temperature management device based on the first command to cool the electrical device.

2. The system of claim 1, wherein the autonomous driving emergency operation is performed by the one or more processors being configured to disable the autonomous vehicle from being driven in the autonomous mode.

3. The system of claim 1,
wherein the autonomous driving emergency operation includes sending a message to be displayed on a monitor associated with the one or more computers, wherein the message indicates a recommendation to disengage the autonomous mode on the autonomous vehicle, and
wherein the message includes an identification of the electrical device and a timer that indicates when the electrical device is expected to reach a known highest operating temperature.

4. The system of claim 1, wherein prior to the autonomous driving operations being performed, the one or more processors included in the one or more computers are further configured to:
receive a third message that includes a third temperature value from the temperature sensor associated with the electrical device;

perform a determination that the third temperature value is greater than a pre-defined threshold value; and prevent, in response to the determination, the autonomous vehicle from performing the autonomous driving operations.

5. The system of claim 4, wherein the pre-defined threshold value is the second pre-determined threshold value.

6. The system of claim 1, wherein the electrical device includes a power supply box, an inverter, or a backup power supply device.

7. The system of claim 1, wherein the temperature management device includes a fan, a liquid cooling device, or a liquid-to-air cooling device.

8. The system of claim 1, wherein the first command instructs the temperature management device to turn on.

9. The system of claim 1, wherein the first message and the second message include an identifier associated with the electrical device.

10. A method of managing temperature in an autonomous vehicle, comprising:
performing autonomous driving operations that operate the autonomous vehicle in an autonomous mode;
receiving a first message that includes a first temperature value from a temperature sensor associated with an electrical device located on or in the autonomous vehicle while the autonomous vehicle is operated in the autonomous mode, wherein the first temperature value indicates a temperature at which the electrical device is operating;
performing a first determination that the first temperature value is greater than a first pre-determined threshold value;
sending, in response to the first determination, a first command that instructs a temperature management device associated with the electrical device to cool the electrical device, wherein the first command instructs the temperature management device to increase speed of a motor or pump that circulates air or liquid coolant;
receiving, after sending the first command, a second message that includes a second temperature value from the temperature sensor associated with the electrical device;
performing a second determination that the second temperature value is greater than a second pre-determined threshold value, wherein the second pre-determined threshold value is higher than the first pre-determined threshold value;
performing, in response to the second determination, an autonomous driving emergency operation;
receiving, after performing the autonomous driving emergency operation, an indication that the autonomous vehicle is instructed to turn off or one or more computers located in the autonomous vehicle are instructed to turn off; and
sending, after receiving the indication, a second command to the temperature management device that instructs the temperature management device to cool the electrical device for a pre-determined time after the autonomous vehicle is turned off or the one or more computers are turned off.

11. The method of claim 10, wherein the autonomous driving emergency operation includes performing driving operations that cause the autonomous vehicle to be parked on a side of a road.

12. The method of claim 10, further comprising:
receiving a third message that includes a third temperature value from the temperature sensor associated with the electrical device;
performing a determination that the third temperature value is greater than a pre-defined threshold value; and
preventing, in response to the determination, the autonomous vehicle from performing the autonomous driving operations.

13. The method of claim 10, wherein the temperature management device includes an air-conditioning unit.

14. The method of claim 10, wherein the first command instructs the temperature management device to reduce a temperature of air circulated by the temperature management device.

15. The method of claim 10, wherein the electrical device includes a network router, an Ethernet switch, or one or more computers.

16. A non-transitory computer readable storage medium having code stored thereon, the code, when executed by a processor, causing the processor to implement a method of managing temperature in an autonomous vehicle, comprising:
performing autonomous driving operations that operate the autonomous vehicle in an autonomous mode;
receiving a first message that includes a first temperature value from a temperature sensor associated with an electrical device located on or in the autonomous vehicle while the autonomous vehicle is operated in the autonomous mode, wherein the first temperature value indicates a temperature at which the electrical device is operating;
performing a first determination that the first temperature value is greater than a first pre-determined threshold value;
sending, in response to the first determination, a first command that instructs a temperature management device associated with the electrical device to cool the electrical device, wherein the first command instructs the temperature management device to increase speed of a motor or pump that circulates air or liquid coolant;
receiving, after sending the first command, a second message that includes a second temperature value from the temperature sensor associated with the electrical device;
performing a second determination that the second temperature value is greater than a second pre-determined threshold value, wherein the second pre-determined threshold value is higher than the first pre-determined threshold value;
performing, in response to the second determination, an autonomous driving emergency operation;
receiving, after performing the autonomous driving emergency operation, an indication that the autonomous vehicle is instructed to turn off or one or more computers located in the autonomous vehicle are instructed to turn off; and
sending, after receiving the indication, a second command to the temperature management device that instructs the temperature management device to cool the electrical device for a pre-determined time after the autonomous vehicle is turned off or the one or more computers are turned off.

17. The non-transitory computer readable storage medium of claim 16,
wherein the autonomous driving emergency operation includes sending a message to be displayed on a monitor associated with the one or more computers, wherein the message indicates a recommendation to disengage the autonomous mode on the autonomous vehicle, and wherein the message includes an identification of the electrical device and a timer that indicates when the electrical device is expected to reach a known highest operating temperature.

18. The non-transitory computer readable storage medium of claim 16, wherein the autonomous driving emergency operation includes performing driving operations that cause the autonomous vehicle to be parked on a side of a road.

19. The non-transitory computer readable storage medium of claim 16, wherein the method further comprises:

receiving a third message that includes a third temperature value from the temperature sensor associated with the electrical device;

performing a determination that the third temperature value is greater than a pre-defined threshold value; and preventing, in response to the determination, the autonomous vehicle from performing the autonomous driving operations.

20. The non-transitory computer readable storage medium of claim 16, wherein the first command instructs the temperature management device to reduce a temperature of air circulated by the temperature management device.

* * * * *